(12) United States Patent
Lee et al.

(10) Patent No.: US 10,026,558 B1
(45) Date of Patent: Jul. 17, 2018

(54) MULTILAYER CAPACITOR AND BOARD HAVING THE SAME MOUNTED THEREON

(71) Applicant: SAMSUNG ELECTRO-MECHANICS CO., LTD., Suwon-si, Gyeonggi-do (KR)

(72) Inventors: Hyo Youn Lee, Suwon-si (KR); Taek Jung Lee, Suwon-si (KR); Won Young Lee, Suwon-si (KR); Sung Kwon An, Suwon-si (KR); Jin Kyung Joo, Suwon-si (KR); Jin Man Jung, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/879,100

(22) Filed: Jan. 24, 2018

(30) Foreign Application Priority Data

Apr. 11, 2017 (KR) .................. 10-2017-0046860

(51) Int. Cl.
*H05K 1/16* (2006.01)
*H01G 4/30* (2006.01)
*H05K 1/18* (2006.01)
*H01G 4/232* (2006.01)

(52) U.S. Cl.
CPC .............. *H01G 4/30* (2013.01); *H01G 4/232* (2013.01); *H05K 1/181* (2013.01); *H05K 2201/10015* (2013.01)

(58) Field of Classification Search
CPC .......... H01G 4/30; H01G 4/232; H05K 1/181; H05K 2201/10015
USPC ................................ 174/250, 251, 255–262
See application file for complete search history.

(56) References Cited

U.S. PATENT DOCUMENTS

2014/0104750 A1    4/2014   Ahn et al.

FOREIGN PATENT DOCUMENTS

| KR | 10-2014-0011765 A | 1/2014 |
| KR | 10-1376839 B1 | 3/2014 |

*Primary Examiner* — Tremesha S Willis
(74) *Attorney, Agent, or Firm* — McDermott Will & Emery LLP

(57) ABSTRACT

A multilayer capacitor includes a capacitor body including a dielectric layer and a first internal electrode and a second internal electrode; a first via electrode exposed through first and second surfaces of the capacitor body, connected to the first internal electrode and spaced apart from the second internal electrode, a second via electrode exposed through the first and second surfaces of the capacitor body, and connected to the second internal electrode and spaced apart from the first internal electrode, a first and second external electrodes disposed on the first surface of the capacitor body to be spaced apart from each other, and connected to the first and the second via electrodes, respectively, and first and second covers disposed in sequence from a bottom in the second surface of the capacitor body, wherein the first and second cover are formed of different materials.

16 Claims, 5 Drawing Sheets

MULTILAYER CAPACITOR AND BOARD HAVING THE SAME MOUNTED THEREON

CROSS-REFERENCE TO RELATED APPLICATION

This application claims the benefit of priority to Korean Patent Application No. 10-2017-0046860, filed on Apr. 11, 2017 with the Korean Intellectual Property Office, the entirety of which is incorporated herein by reference.

TECHNICAL FIELD

The present disclosure relates to a multilayer capacitor and a board having the same mounted thereon.

BACKGROUND

A multilayer capacitor, a multilayer chip electronic component, is mounted on the boards of various types of electronic products including display devices, such as liquid crystal displays (LCD), plasma display panels (PDP), and the like, computers, personal digital assistants (PDAs), mobile phones, and the like, and serves to charge or discharge electricity.

The multilayer capacitor is small, a capacitance thereof is guaranteed, and mounting thereof is easily performed. Due to the advantages described above, such a multilayer capacitor may be used as a component of various electronic devices.

In recent product trends, multilayer capacitors have been required to have improved performance, increased usage current, higher degrees of performance, reduced usage voltage to increase battery usage times, and to be slim. In order to satisfy such trends, high-density mounting of multilayer capacitors on boards has been required.

Thus, a multilayer capacitor having a structure in which a via electrode is formed in a body to increase a length of an internal electrode has been proposed. As described above, when a via electrode is applied to connect an internal electrode and an external electrode, capacitance of a capacitor is increased, according to a size of the via electrode. In addition, an operation of separately coating an external electrode to be connected to an internal electrode may be omitted.

However, in a case of a via electrode structure, a portion of a via electrode is exposed to an upper surface of a body, as it is. Thus, after a via fill operation of filling a via with a conductive material is performed, an electrode may be detached, and reliability may be lowered by moisture penetration. Thus, a solution to the problem described above is required.

Moreover, in a bottom electrode structure, due to a difference in contraction rates of the body and an external electrode formed on a mounting surface (a bottom) of the body, a camber phenomenon in which an upper portion of a product is upwardly convex may occur.

SUMMARY

An aspect of the present disclosure provides a multilayer capacitor to be mounted at a high density, having increased moisture resistance reliability, and reducing a camber phenomenon, and a board having the same mounted thereon.

According to an aspect of the present disclosure, a multilayer capacitor includes: a capacitor body including a dielectric layer as well as a first internal electrode and a second internal electrode alternately disposed with the dielectric layer interposed therebetween, and including a first surface and a second surface opposing each other, a third surface and a fourth surface connected to the first surface and the second surface while opposing each other, as well as a fifth surface and a sixth surface connected to the first surface and the second surface, connected to the third surface and the fourth surface, while opposing each other; a first via electrode passing through the first internal electrode and the second internal electrode and exposed through the first surface and the second surface of the capacitor body, connected to the first internal electrode and spaced apart from the second internal electrode; a second via electrode passing through the first internal electrode and the second internal electrode and exposed through the first surface and the second surface of the capacitor body, and connected to the second internal electrode and spaced apart from the first internal electrode; a first external electrode and a second external electrode disposed on the first surface of the capacitor body to be spaced apart from each other, and connected to the first via electrode and the second via electrode, respectively; and a first cover and a second cover disposed in sequence from a bottom in the second surface of the capacitor body. Here, the first cover and the second cover are formed of different materials.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
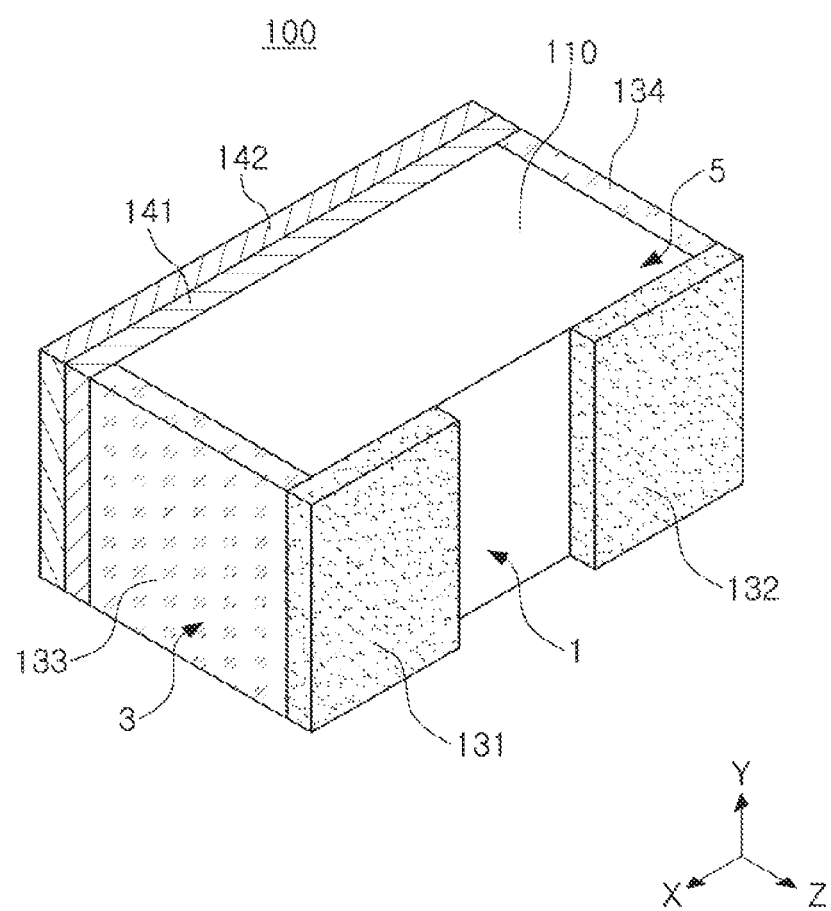
FIGS. 1 and 2 are perspective views schematically illustrating a multilayer capacitor according to an embodiment.

Hereinafter, embodiments of the present disclosure will be described as follows with reference to the accompanying drawings. In the accompanying drawings, shapes, sizes and the like, of the components may be exaggerated or shortened for clarity.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as 'above,' upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

In order to clearly illustrate the embodiments of the present invention, when a direction of a capacitor body is defined, X, Y, and Z illustrated in the drawing represent a longitudinal direction, a width direction, and a thickness direction, respectively. Here, the thickness direction may be used in the same sense as the stacking direction of a dielectric layer and an internal electrode.

Moreover, in an embodiment, for convenience of explanation, surfaces of a capacitor body 110 opposing each other in a Z direction are set as a first surface 1 and a second surface 2, surfaces opposing each other in an X direction and connecting ends of the first surface 1 and the second surface 2 are set as a third surface 3 and a fourth surface 4, and surfaces opposing each other in a Y direction and connecting ends of the first surface 1 and the second surface 2, as well as the third surface 3 and the fourth surface 4 are set as a fifth surface 5 and a sixth surface 6. Here, the first surface 1 may be used in the same sense as a mounting surface.

Multilayer Capacitor

Figure 2:
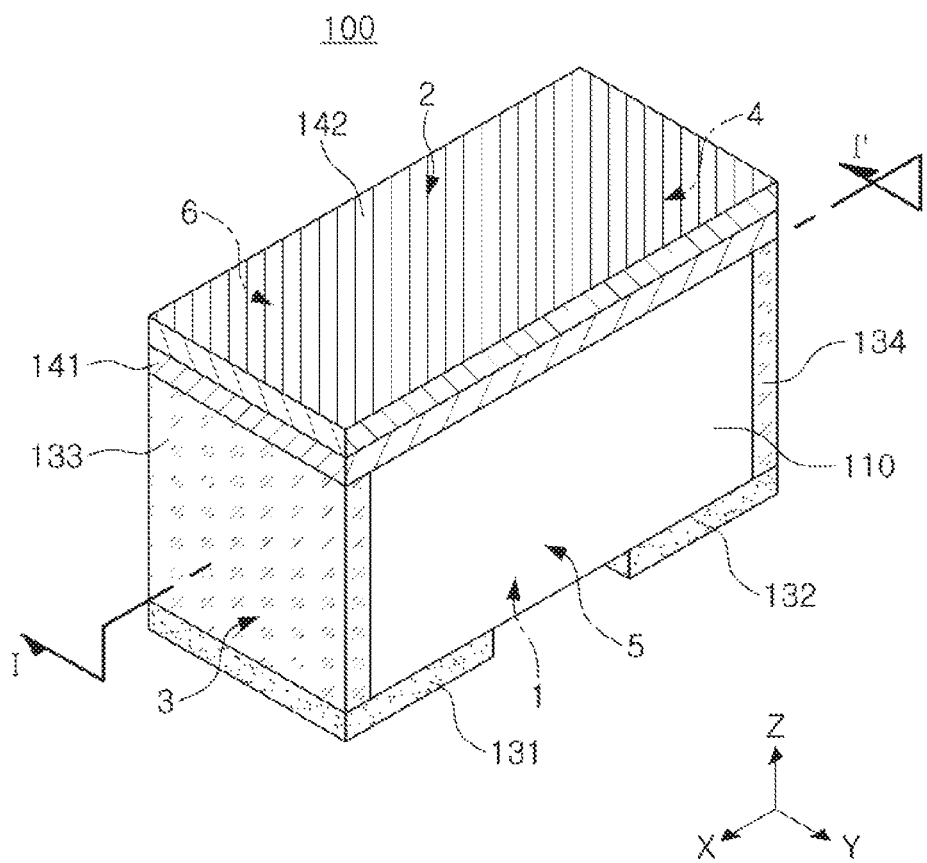
Figure 3:
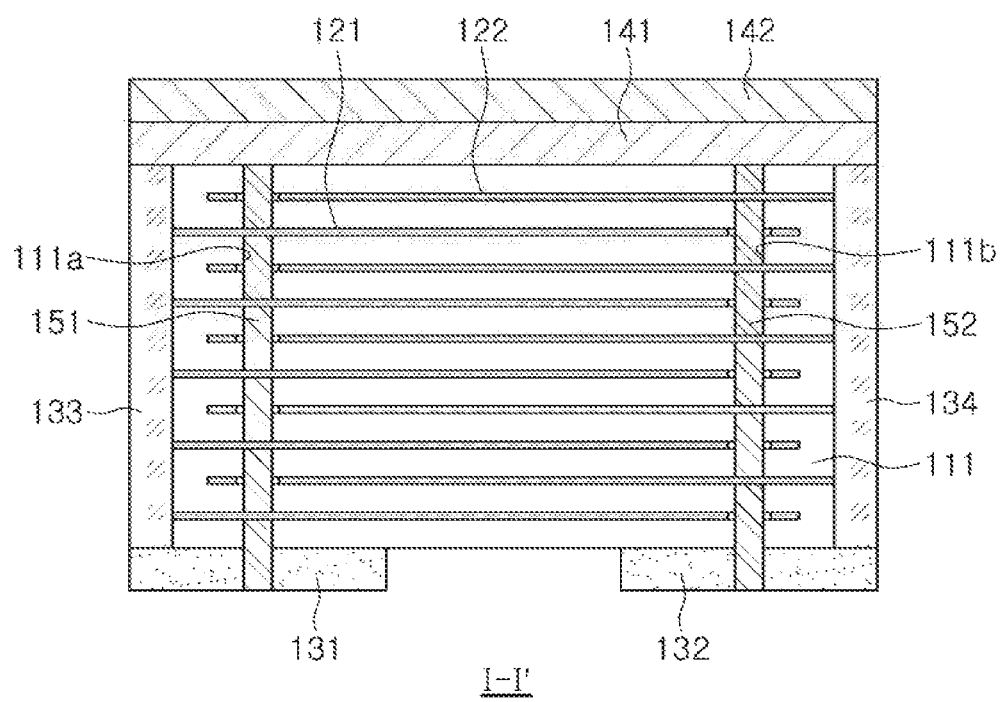
FIG. 3 is a cross-sectional view taken along line I-I' of FIG. 2.
Figure 4A:
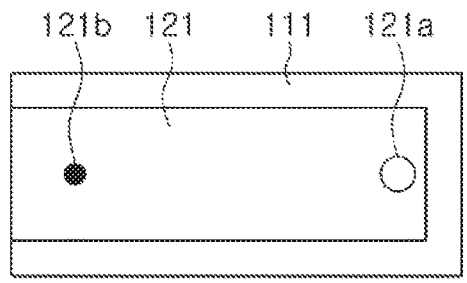
FIGS. 4A and 4B are plan views illustrating a structure of a first internal electrode and a second internal electrode in a multilayer capacitor according to an embodiment.
Figure 4B:
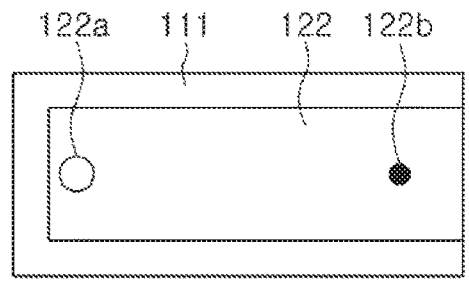
Figure 5:
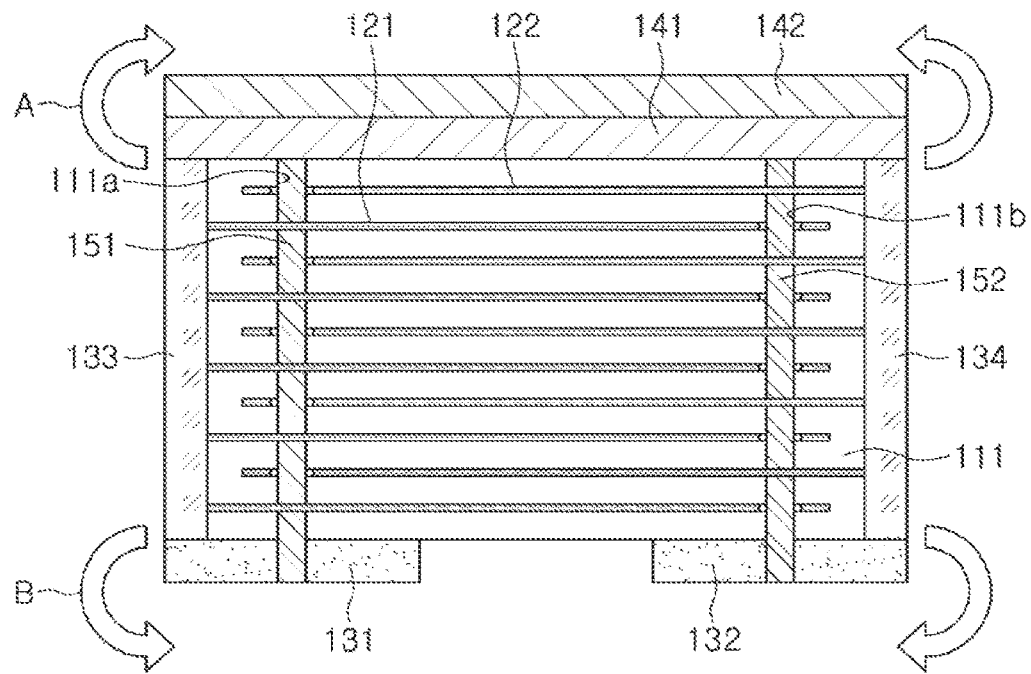
FIG. 5 is a cross-sectional view illustrating a contraction rate of a first external electrode and a second external electrode of a body.

FIGS. 1 and 2 are perspective views schematically illustrating a multilayer capacitor according to an embodiment. FIG. 3 is a cross-sectional view taken along line I-I' of FIG. 2. FIGS. 4A and 4B are plan views illustrating structures of a first internal electrode and a second internal electrode in a multilayer capacitor according to an embodiment, respectively. FIG. 5 is a cross-sectional view illustrating a contraction rate of a body as well as a first external electrode and a second external electrode.

Referring to FIGS. 1 through 5, a multilayer capacitor 100 according to an embodiment includes a capacitor body 110 including a dielectric layer 111 and a plurality of first internal electrodes 121 and a plurality of second internal electrodes 122, a first via electrode 151 and a second via electrode 152, a first external electrode 131 and a second external electrode 132, as well as a first cover 141 and a second cover 142.

The capacitor body 110 is formed by stacking a plurality of dielectric layers 111, and is not particularly limited, but may have a roughly hexahedral shape as illustrated in the drawing.

In this case, a shape and dimensions of the capacitor body 110 and the stacking number of dielectric layers 111 are not limited to those illustrated in the drawing.

In addition, the dielectric layer 111 is in a sintered state, and boundaries between adjacent dielectric layers 111 may be integrated, such that it may be difficult to confirm boundaries therebetween without using a scanning electron microscope (SEM).

Moreover, the capacitor body 110 may include an active region including the first internal electrode 121 and the second internal electrode 122, as a portion contributing to capacitance formation, and cover regions disposed on an upper portion and a lower portion of the active region in the Z direction, as margin portions.

The active region may be formed by repeatedly stacking the plurality of first internal electrodes 121 and the plurality of second internal electrodes 122 with the dielectric layer 111 interposed therebetween.

In this case, a thickness of the dielectric layer 111 may be arbitrarily changed according to a capacitance design of the multilayer capacitor 100.

Moreover, the dielectric layer 111 may include a ceramic powder having a high dielectric constant, for example, a barium titanate ($BaTiO_3$)-based or a strontium titanate ($SrTiO_3$)-based powder, but an embodiment is not limited thereto.

Moreover, in the dielectric layer 111, at least one or more of a ceramic additive, an organic solvent, a plasticizer, a binder, a dispersant, and the like may be added with the ceramic powder when necessary.

The cover regions are located in an upper portion and a lower portion of the capacitor body 110 in the Z direction, respectively, and may have the same material and configuration as the dielectric layer 111 except that an internal electrode is not included.

The cover regions may be prepared by stacking a single dielectric layer 111 or two or more dielectric layers 111 in an upper external portion and a lower external portion of the active region in the Z direction, and may basically serve to prevent damage to the first internal electrode 121 and the second internal electrode 122 by physical or chemical stress.

The first internal electrode 121 and the second internal electrode 122 are electrodes having different polarities.

Moreover, the first internal electrode 121 and the second internal electrode 122 are alternately disposed in the Z direction with the dielectric layer 111 interposed therebetween in the capacitor body 110, and an area in which the first internal electrode 121 and the second internal electrode 122 overlap each other in the Z direction is related to capacitance formation of a capacitor.

First ends of the first internal electrode 121 and the second internal electrode 122 are exposed through a third surface 3 and a fourth surface 4 of the capacitor body 110, respectively.

Moreover, the first internal electrode 121 and the second internal electrode 122 may be formed by printing conductive paste including a conductive metal at a predetermined thickness on the dielectric layer 111, and may be electrically insulated from each other by the dielectric layer 111 interposed therebetween.

The conductive metal included in the conductive paste may be, for example, nickel (Ni), copper (Cu), palladium (Pd), or alloys thereof, but an embodiment is not limited thereto.

Moreover, a printing method of the conductive paste may be screen printing, gravure printing, or the like, but an embodiment is not limited thereto.

According to an embodiment, the capacitor body 110 has a first via through-hole 111a and a second via through-hole 111b. The first via through-hole 111a and the second via through-hole 111b may be formed by a laser or mechanical punching in a position corresponding to a position through which each of the first via electrode 151 and the second via electrode 152 passes in the dielectric layer 111.

Moreover, the first via through-hole 111a and the second via through-hole 111b are disposed to be spaced apart from each other in the X direction.

The first via through-hole 111a and the second via through-hole 111b are filled with a conductive material or castellation is performed therein, so the first via electrode 151 and the second via electrode 152 may be formed.

The first via electrode 151 passes through the first internal electrode 121 and the second internal electrode 122 in the Z direction in the first via through hole 111a, so an upper end and a lower end are exposed through the first surface 1 and the second surface 2 of the capacitor body 110.

The second via electrode 152 passes through the first internal electrode 121 and the second internal electrode 122 in the Z direction in the second via through hole 111b, so an upper end and a lower end are exposed through the first surface 1 and the second surface 2 of the capacitor body 110.

The first internal electrode 121 has a first via hole 121b and a first via spacing hole 121a.

The first via hole 121b is formed in a position corresponding to the first via through hole 111a while having a size corresponding to the first via through hole 111a, so the plurality of first internal electrodes 121 are in contact with and are electrically connected to the first via electrode 151.

The first via spacing hole 121a is formed in a position corresponding to the second via through hole 111b while being larger than the second via through hole 111b, and allows the first internal electrode 121 and the second via electrode 152 to be spaced apart from each other, so the first internal electrode 121 may not be electrically connected to the second via electrode 152.

The second internal electrode 122 may have a second via hole 122b and a second via spacing hole 122a.

The second via hole 122b is formed in a position corresponding to the second via through hole 111b while having a size corresponding to the second via through hole 111b, so the plurality of second internal electrodes 122 are in contact with and are electrically connected to the second via electrode 152.

The second via spacing hole 122a is formed in a position corresponding to the first via through hole 111a while being larger than the first via through hole 111a, and allows the second internal electrode 122 and the first via electrode 151 to be spaced apart from each other, so the second internal electrode 122 may not be electrically connected to the first via electrode 151.

The first external electrode 131 and the second external electrode 132 are disposed on the first surface 1 of the capacitor body 110 to be spaced apart from each other in the X direction, and may be connected to lower ends of the first via electrode 151 and the second via electrode 152, respectively.

The multilayer capacitor 100 according to an embodiment may further include a third external electrode 133 and a fourth external electrode 134.

The third external electrode 133 and the fourth external electrode 134 are disposed on the third surface 3 and the fourth surface 4 of the capacitor body 110, respectively, and are in contact with and electrically connected to the first internal electrode 121 and the second internal electrode 122.

In this case, lower ends of the third external electrode 133 and the fourth external electrode 134 are connected to ends of the first external electrode 131 and the second external electrode 132.

In an embodiment, the third external electrode 133 and the fourth external electrode 134 are not separately formed, and the first external electrode 131 and the second external electrode 132 are extended onto the third surface 3 and the fourth surface 4 of the capacitor body 110, respectively.

Moreover, an external electrode according to an embodiment may further include an extension portion covering a portion of a fifth surface 5 and a sixth surface 6 of the capacitor body 110 when necessary.

As described above, when an internal electrode is electrically connected to an external electrode formed on a mounting surface of a capacitor body through a via electrode formed in a stacking direction of a dielectric layer, an area of overlap of internal electrodes having different polarities is increased, so a thickness of a dielectric layer and an internal electrode may be decreased. Thus, without increasing the stacking number or increasing a dielectric constant, capacitance of a product may be increased while having the same size as a product of the related art.

Thus, while equivalent series inductance (ESL) is lowered, a size of a product is reduced to less than 1005-size, so a mounting area may be significantly reduced when a product is mounted on a board.

The first cover 141 and the second cover 142 are disposed in sequence from a bottom in the second surface 2 of the capacitor body 110, and are formed of different materials.

Upper ends of the first via electrode 151 and the second via electrode 152, having been exposed, may be in contact with a lower surface of the first cover 141. In other words, the first cover 141 may serve to cover an exposed portion of the first via electrode 151 and the second via electrode 152 to be insulated.

In an embodiment, the first cover 141 may be formed of a ceramic or a dielectric. Thus, the capacitor body 110 and the first cover 141 disposed on an upper surface are prevented from reacting with each other, so stability of a body may be increased. In this case, the first cover 141 may be formed by attaching a required number of separate ceramic sheets, or the like, but an embodiment is not limited thereto.

Moreover, the first cover 141 may further include a second component including at least one of a first component, such as aluminum (Al), calcium (Ca), silicon (Si), and magnesium (Mg), and a third component, an organic solvent, such as a binder, or the like. In this case, a size of a particle of the aluminum may be 100 nm to 150 nm. As described above, when the first cover 141 includes aluminum, strength and moisture resistance may be further improved, compared to the case in which aluminum is not included in the first cover.

Moreover, the second cover 142 may be formed of a resin, an insulating material, for example, epoxy resin, but an embodiment is not limited thereto.

The epoxy resin is based on silica, and may further include Mn ferrite. As described above, when the second cover 142 includes the Mn ferrite, the second cover 142 may be black. Thus, the first via electrode 151 and the second via electrode 152 of the multilayer capacitor 100, having been completed, may not be visible from the outside.

Moreover, in an embodiment, a thickness of the first cover 141 may be in a range from about 9 μm to about 15 μm, and a thickness of the second cover 142 may in a range from about 1 μm to about 3 μm.

Referring to Table 1, when a thickness of a first cover is in the range from about 9 μm to about 15 μm and a thickness of a second cover is in the range from about 1 μm to about 3 μm, a moisture resistance reliability defect did not occur, and a portion of a camber was small.

TABLE 1

| # | First cover (μm) | Second cover (μm) | Moisture resistance reliability | Camber |
| --- | --- | --- | --- | --- |
| 1 | 1 | 1 | X | Large |
| 2 | 1 | 2 | X | Large |
| 3 | 1 | 3 | X | Large |
| 4 | 3 | 1 | X | Large |
| 5 | 3 | 2 | X | Large |
| 6 | 3 | 3 | X | Large |
| 7 | 5 | 1 | X | Medium |
| 8 | 5 | 2 | Δ | Medium |
| 9 | 5 | 3 | Δ | Medium |
| 10 | 7 | 1 | Δ | Medium |
| 11 | 7 | 2 | Δ | Medium |
| 12 | 7 | 3 | Δ | Medium |
| 13 | 9 | 1 | Δ | Medium |
| 14 | 9 | 2 | O | Medium |
| 15 | 9 | 3 | O | Small |
| 16 | 11 | 1 | O | Small |
| 17 | 11 | 2 | O | Small |
| 18 | 11 | 3 | O | Small |
| 19 | 13 | 1 | O | Small |
| 20 | 13 | 2 | O | Small |
| 21 | 13 | 3 | O | Small |
| 22 | 15 | 1 | O | Small |
| 23 | 15 | 2 | O | Small |
| 24 | 15 | 3 | O | Small |
| 25 | 17 | 1 | O | Large |
| 26 | 17 | 2 | O | Large |
| 27 | 17 | 3 | O | Large |
| 28 | 19 | 1 | O | Large |
| 29 | 19 | 2 | O | Large |
| 30 | 19 | 3 | O | Large |

According to an embodiment, the first cover 141 and the second cover 142 may serve to improve reliability of a capacitor by further securing a margin at a predetermined thickness and increasing durability of the capacitor body 110. Moreover, an exposed portion of the first via electrode 151 and the second via electrode 152 is covered, so reliability may be further increased.

Meanwhile, the first cover 141 and the second cover 142 are formed after the capacitor body 110 is formed. Thus, when a thickness of the capacitor body 110 is significantly reduced within a limit at which durability of the capacitor body 110 and reliability of a capacitor are maintained at a certain level, a size of a product may be significantly reduced.

Moreover, according to an embodiment, a camber phenomenon may be reduced. For example, in a case in which a thickness of a capacitor body is in a range from about 45 μm to about 100 μm, due to a difference in a contraction rate between a body, and a first external electrode and a second external electrode, a camber phenomenon of about 5 μm to about 10 μm occurs downwardly. Here, a first cover and a second cover are formed, so a contraction rate of a capacitor body is reduced, so a camber phenomenon may be reduced.

Referring to FIG. 5, arrow A indicates a contraction rate of a body, and arrow B indicates a contraction rate of a first external electrode and a second external electrode.

As illustrated in the drawing, when the first cover 141 and the second cover 142 are applied, a contraction rate of the capacitor body 110 is reduced. Thus, a camber phenomenon, caused by a contraction rate of a first external electrode 131 and a second external electrode 132 disposed on a first surface 1, a mounting surface of a capacitor body 110 according to the related art, may be reduced.

Board Having Multilayer Capacitor Mounted Thereon

Figure 6:
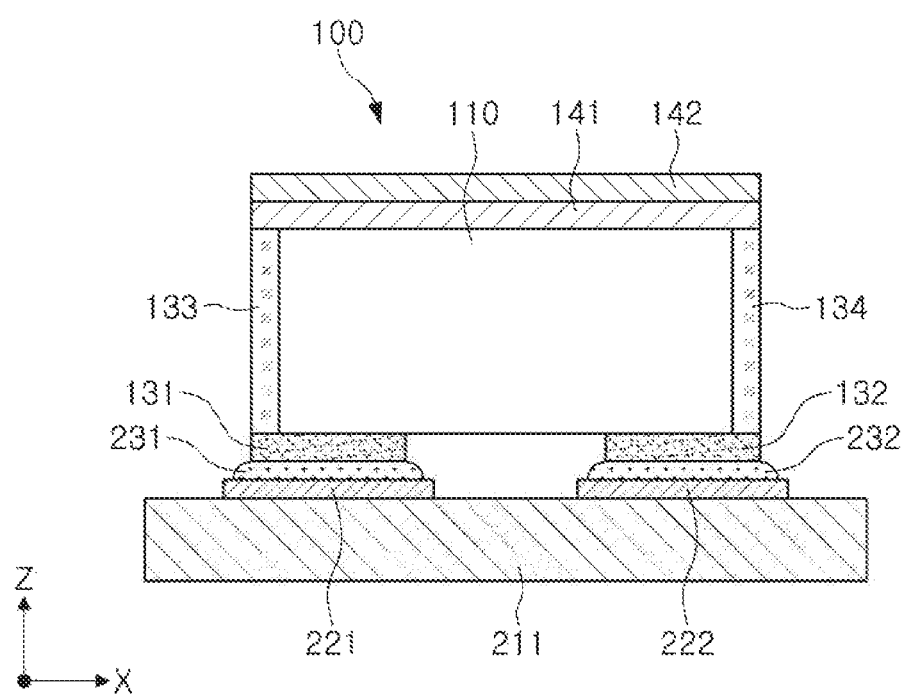
FIG. 6 is a side view illustrating the multilayer capacitor of FIG. 1 mounted on a board.

Referring to FIG. 6, a board having a multilayer capacitor mounted thereon according to an embodiment includes a board 211 on which a multilayer capacitor 100 is mounted, as well as a first electrode pad 221 and a second electrode pad 222 disposed on an upper surface of the board 211 to be spaced apart from each other in the X direction.

The multilayer capacitor 100 is fixed by solders 231 and 232 while the first external electrode 131 and the second external electrode 132 are located to be in contact with the first electrode pad 221 and the second electrode pad 222, and is electrically connected to the board 211.

As set forth above, according to an embodiment, a multilayer capacitor may be mounted at a high density, moisture resistance reliability may be improved, and a contraction rate of a body may be compensated for, so a camber phenomenon of the entirety of a multilayer capacitor may be reduced.

While embodiments have been shown and described above, it will be apparent to those skilled in the art that modifications and variations could be made without departing from the scope of the present invention as defined by the appended claims.

What is claimed is:

1. A multilayer capacitor, comprising: a capacitor body including a dielectric layer, a first internal electrode and a second internal electrode alternately disposed with the dielectric layer interposed therebetween, the capacitor body having a first surface and a second surface opposing each other, a third surface and a fourth surface opposing each other and each connected to the first surface and the second surface, and a fifth surface and a sixth surface opposing each other and each connected to the first surface, the second surface, the third surface and the fourth surface; a first via electrode passing through the first internal electrode and the second internal electrode and exposed through the first surface and the second surface of the capacitor body, the first via electrode being connected to the first internal electrode and being spaced apart from the second internal electrode; a second via electrode passing through the first internal electrode and the second internal electrode and exposed through the first surface and the second surface of the capacitor body, the second via electrode being connected to the second internal electrode and being spaced apart from the first internal electrode; a first external electrode and a second external electrode disposed on the first surface of the capacitor body to be spaced apart from each other and connected to the first via electrode and the second via electrode, respectively; and a first cover and a second cover disposed in sequence from a bottom on the second surface of the capacitor body, wherein the first cover and the second cover are formed of different materials.

2. The multilayer capacitor of claim 1, wherein the first cover is formed of a ceramic or a dielectric, and the second cover is formed of resin.

3. The multilayer capacitor of claim 2, wherein the second cover is formed of epoxy resin.

4. The multilayer capacitor of claim 1, wherein the dielectric layer has a first via through-hole and a second via through-hole formed to allow the first via electrode and the second via electrode to pass therethrough, the first internal electrode includes a first via hole formed in a position corresponding to the first via through-hole and having a size corresponding to the first via through-hole, and a first via spacing hole formed in a position corresponding to the second via through-hole and formed to be larger than the second via through-hole, and the second internal electrode includes a second via hole formed in a position corresponding to the second via through-hole and having a size corresponding to the second via through-hole, and a second via spacing hole formed in a position corresponding to the first via through-hole and formed to be larger than the first via through-hole.

5. The multilayer capacitor of claim 1, wherein the first internal electrode and the second internal electrode are exposed through the third surface and the fourth surface of the capacitor body, respectively, the multilayer capacitor further comprises a third external electrode and a fourth external electrode disposed on the third surface and the fourth surface of the capacitor body, respectively, and the third external electrode and the fourth external electrode are connected to the first external electrode and the second external electrode, respectively.

6. The multilayer capacitor of claim 1, wherein the first internal electrode and the second internal electrode are exposed through the third surface and the fourth surface of the capacitor body, respectively, and the first external electrode and the second external electrode are extended onto the third surface and the fourth surface of the capacitor body, respectively.

7. The multilayer capacitor of claim 1, wherein ends of the first via electrode and the second via electrode are in contact with the first cover.

8. The multilayer capacitor of claim 1, wherein a thickness of the first cover is in a range from 9 μm to 15 μm, and a thickness of the second cover is in a range from 1 μm to 3 μm.

9. A board having a multilayer capacitor mounted thereon, comprising:

a board having a first electrode pad and a second electrode pad disposed to be spaced apart from each other; and the multilayer capacitor according to claim 1 mounted on the board as a first external electrode and a second external electrode are connected to the first electrode pad and the second electrode pad, respectively.

10. The board of claim 9, wherein the first cover is formed of a ceramic or a dielectric, and the second cover is formed of resin.

11. The board of claim 10, wherein the second cover is formed of epoxy resin.

12. The board of claim 9, wherein the dielectric layer has a first via through-hole and a second via through-hole formed to allow the first via electrode and the second via electrode to pass therethrough, the first internal electrode includes a first via hole formed in a position corresponding to the first via through-hole and having a size corresponding to the first via through-hole, and a first via spacing hole formed in a position corresponding to the second via through-hole and formed to be larger than the second via through-hole, and the second internal electrode includes a second via hole formed in a position corresponding to the second via through-hole and having a size corresponding to the second via through-hole, and a second via spacing hole formed in a position corresponding to the first via through-hole and formed to be larger than the first via through-hole.

13. The board of claim 9, wherein the first internal electrode and the second internal electrode are exposed through the third surface and the fourth surface of the capacitor body, respectively, the multilayer capacitor further comprises a third external electrode and a fourth external electrode disposed on the third surface and the fourth surface of the capacitor body, respectively, and the third external electrode and the fourth external electrode are connected to the first external electrode and the second external electrode, respectively.

14. The board of claim 9, wherein the first internal electrode and the second internal electrode are exposed through the third surface and the fourth surface of the capacitor body, respectively, and the first external electrode and the second external electrode are extended onto the third surface and the fourth surface of the capacitor body, respectively.

15. The board of claim 9, wherein ends of the first via electrode and the second via electrode are in contact with the first cover.

16. The board of claim 9, wherein a thickness of the first cover is in a range from 9 μm to 15 μm, and a thickness of the second cover is in a range from 1 μm to 3 μm.

* * * * *